(12) United States Patent
Kim

(10) Patent No.: US 7,372,448 B2
(45) Date of Patent: May 13, 2008

(54) SENSORS AND SENSOR CIRCUITS WHICH CONVERT SENSE CURRENTS TO DIGITAL VALUES

(75) Inventor: Gyeong-nam Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 609 days.

(21) Appl. No.: 10/954,516

(22) Filed: Sep. 30, 2004

(65) Prior Publication Data

US 2005/0068214 A1 Mar. 31, 2005

(30) Foreign Application Priority Data

Sep. 30, 2003 (KR) ...................... 10-2003-0067909

(51) Int. Cl.
*G09G 3/36* (2006.01)
(52) U.S. Cl. ...................... 345/106; 345/102; 345/87; 349/77
(58) Field of Classification Search .................. 345/87, 345/89, 98–102, 211, 690, 106
See application file for complete search history.

(56) References Cited

U.S. PATENT DOCUMENTS 5,936,603 A * 8/1999 Lippmann et al. .......... 345/101

6,300,945 B1 * 10/2001 Engler et al. ................ 345/211
7,038,647 B2 * 5/2006 Shigeta et al. ................ 345/89

FOREIGN PATENT DOCUMENTS

| JP | HEI 11-174416 | 7/1999 |
|---|---|---|
| JP | HEI 15-207763 | 7/2003 |

OTHER PUBLICATIONS

Notice to Submit Response, Korean Application No. 10-2003-0067909, Jun. 30, 2005.

* cited by examiner

*Primary Examiner*—Duc Q Dinh
(74) *Attorney, Agent, or Firm*—Myers Bigel Sibley & Sajovec PA

(57) ABSTRACT

A sensor circuit, e.g., a circuit for use with a sensor that develops a current responsive to temperature, includes a digital to analog (D/A) comparison circuit having an analog sense current input and a digital input, the D/A comparison circuit operative to compare a digital value at the digital input to a sense current at the sense current input and to responsively generate a comparison signal. The sensor circuit further includes a control circuit configured to provide digital values to the digital input of the D/A comparison circuit responsive to the comparison signal and to generate a digital output corresponding to the sense current.

28 Claims, 7 Drawing Sheets

SENSORS AND SENSOR CIRCUITS WHICH CONVERT SENSE CURRENTS TO DIGITAL VALUES

RELATED APPLICATION

This application claims the priority of Korean Patent Application No. 2003-67909 filed on Sep. 30, 2003 in the Korean Intellectual Property Office, the disclosure of which is incorporated herein in its entirety by reference.

BACKGROUND OF THE INVENTION

The present invention relates to sensors and sensing methods, and more particularly, to current sensors and sensing methods suitable for temperature sensing in an integrated circuit (IC), such as a liquid crystal display (LCD) driving IC.

A super twisted nematic (STN) LCD typically is driven by an LCD driving IC. A typical STN LCD has an LCD on/off voltage, i.e., a threshold voltage of the LCD, which changes according to the ambient temperature. Also, the temperature characteristics of the STN LCD may change responsive to various factors, including manufacturing processes and LCD functions. The LCD driving voltage generated by the LCD driving IC preferably has substantially the same temperature characteristics as the STN LCD so that LCD contrast can be maintained substantially constant.

A typical conventional LCD driving IC may only provide a predetermined temperature coefficient in an operating temperature range. If the STN LCD has different temperature coefficients in different operating temperature ranges, LCD contrast in a particular operating range may be affected by an LCD driving voltage that is generated by the LCD driving IC. Therefore, it is desirable that the LCD driving voltages be adjusted for the operating temperature. Accordingly, there is a need for a temperature sensor circuit that can be easily integrated into the LCD driving IC and that is capable of precisely sensing temperature.

SUMMARY OF THE INVENTION

In some embodiments of the present invention, a sensor circuit, e.g., a circuit adapted for use with a sensor that develops a current representative of temperature, includes a digital to analog (D/A) comparison circuit having an analog sense current input and a digital input, the D/A comparison circuit operative to compare a digital value at the digital input to a sense current at the sense current input and to responsively generate a comparison signal. The sensor circuit further includes a control circuit configured to provide digital values to the digital input of the D/A comparison circuit responsive to the comparison signal and to generate a digital output corresponding to the sense current.

In some embodiments of the present invention, the D/A comparison circuit includes a voltage generator circuit that generates a reference voltage and a variable voltage responsive to the sense current, a scaling circuit that scales the variable voltage responsive to the digital value, and a voltage comparator that generates the comparison signal responsive to a comparison of the scaled variable voltage and the reference voltage. The scaling circuit may include a plurality of resistors coupled in series between a node that develops the variable voltage and a signal ground node, and a plurality of switches, respective ones of which are configured to bypass respective ones of the plurality of resistors responsive to respective bits of the digital value at the digital input.

In further embodiments of the present invention, the D/A comparison circuit has a reference adjustment input, and the voltage generator circuit is operative to adjust the reference voltage responsive to a digital value at the reference adjustment input. The voltage generator circuit may include a plurality of resistors coupled in series between a node that develops the reference voltage and a signal ground node and a plurality of switches, respective ones of which are configured to bypass respective ones of the plurality of resistors responsive to respective bits of the digital value at the reference adjustment input.

According to additional embodiments, the voltage generator circuit includes a first resistor connected between the sense current input and a node at which the variable voltage is developed, a second resistor connected between the node at which the variable voltage is developed and a node at which the reference voltage is developed, a bipolar transistor having its base terminal coupled to its collector terminal and a signal ground node, and a third resistor connected between an emitter terminal of the bipolar transistor and the node at which the reference voltage is developed. The third resistor may include a plurality of resistors connected in series between the emitter terminal of the bipolar transistor and the node at which the variable voltage is developed, and the voltage generator circuit further includes a plurality of switches, respective ones of which are coupled in parallel with respective ones of the plurality of resistors.

In some embodiments of the present invention, the voltage generator circuit includes a first resistor connected between the sense current input and a node at which the variable voltage is developed, a second resistor connected between the node at which the variable voltage is developed and a node at which the reference voltage is developed, a field effect transistor having its gate terminal coupled to its drain terminal and a signal ground node and a third resistor connected between a source terminal of the field effect transistor and the node at which the reference voltage is developed. The third resistor may include a plurality of resistors connected in series between the source terminal of the field effect transistor and the node at which the variable voltage is developed, and the voltage generator circuit may further include a plurality of switches, respective ones of which are coupled in parallel with respective ones of the plurality of resistors.

In still further embodiments of the present invention, the D/A comparison circuit includes a voltage generator circuit that generates a reference voltage and a variable voltage responsive to the sense current, a scaling circuit that scales the reference voltage responsive to the digital value and a voltage comparator that generates the comparison signal responsive to a comparison of the variable voltage and the scaled reference voltage. The scaling circuit may include a plurality of resistors coupled in series between a node that develops the reference voltage and a signal ground node and a plurality of switches, respective ones of which are configured to bypass respective ones of the plurality of resistors responsive to respective bits of the digital value at the digital input.

According to further aspects of the present invention, a temperature sensor includes a digital to analog (D/A) comparison circuit having an analog sense current input and a digital input, the D/A comparison circuit operative to compare a digital value at the digital input to a sense current at the sense current input and to responsively generate a comparison signal, a control circuit configured to provide digital values to the digital input of the D/A comparison circuit responsive to the comparison signal and to generate a digital output corresponding to the sense current and a temperature transducer operative to generate a current at the analog current sense input responsive to temperature.

In still further embodiments of the present invention, an LCD driving IC includes a D/A comparison circuit having an analog sense current input and a digital input. The D/A comparison circuit is operative to compare a digital value at the digital input to a sense current at the sense current input and to responsively generate a comparison signal. The IC further includes a control circuit configured to provide digital values to the digital input of the D/A comparison circuit responsive to the comparison signal and to generate a digital output corresponding to the sense current, and an LCD driving circuit operative to drive an LCD responsive to the generated digital output.

DETAILED DESCRIPTION

The present invention will now be described more fully with reference to the accompanying drawings, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
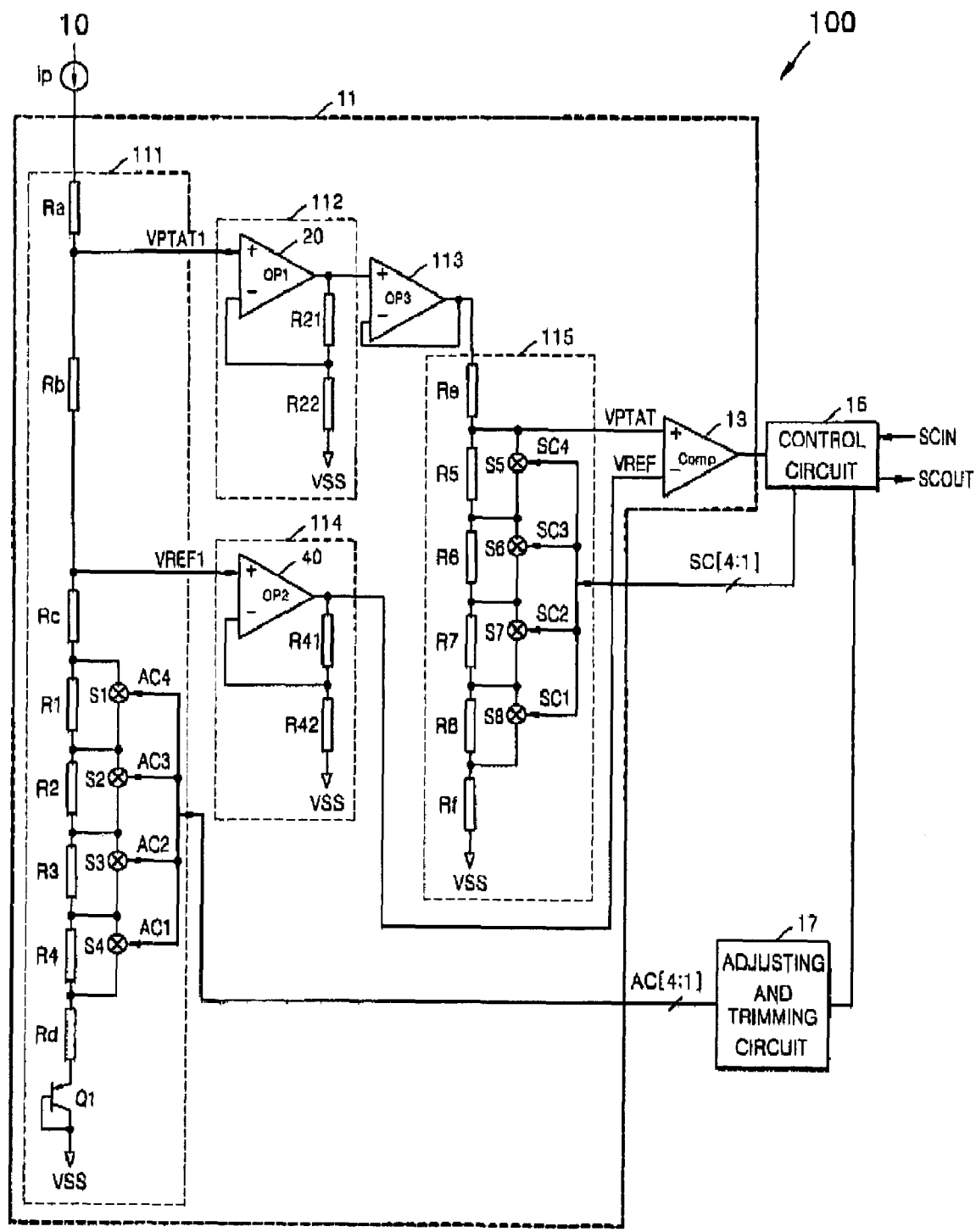
FIG. 1 is a schematic diagram of a temperature sensor according to some embodiments of the present invention.

FIG. 1 is a circuit diagram of temperature sensor including a current-producing temperature transducer 10 and a sensor circuit 100 according to some embodiments of the present invention. The temperature transducer 10 produces a current $I_p$ representative of temperature, and may include any of a number of known temperature transducers. The sensor circuit 100 includes a successive approximation register (SAR) type analog-to-digital (A/D) converter. More specifically, the sensor circuit 100 includes a digital-to-analog (D/A) comparison circuit 11, a SAR type control circuit 15, and an adjusting and trimming circuit 17. The D/A comparison circuit 11 receives a current $I_p$ proportional to temperature and generates a reference voltage VREF that is kept substantially constant as temperature changes. The D/A comparison circuit 11 generates a variable voltage VPTAT proportional to the current $I_p$, in response to temperature sensing control data signal SC[4:1]. The variable voltage VPTAT changes responsive to changes in the temperature sensing control data signal SC[4:1]. A comparator 13 compares the reference voltage VREF and the variable voltage VPTAT. The operating speed of the comparator 13 is related to a period of time required to sense temperature by the sensor circuit. A high-speed comparator may reduce this period of time.

The SAR type control circuit 15 receives an initial value SCIN of the temperature sensing control data SC[4:1] and transmits it to the D/A comparison circuit 11. Upon receiving the initial value SCIN of the temperature sensing control data SC[4:1], the D/A comparison circuit 11 operates, and the control circuit 15, in response to an output of the comparator 13, changes the temperature sensing control data SC[4:1] and feeds a new value of the temperature sensing control data SC[4:1] to the D/A comparison circuit 11. That is, a feedback loop is formed by the D/A comparison circuit 11, the comparator 13, and the control circuit 15.

After repeated operation of the feedback loop, a value of the temperature sensing control data SC[4:1] obtained when the reference voltage VREF and the variable voltage VPTAT are substantially equal, and output as a value SCOUT corresponding to the current temperature. FIG. 1 illustrates the operation of the sensor circuit when the temperature sensing control data SC[4:1] is 4-bit data. However, it will be understood that the temperature sensing control data may have fewer or greater numbers of bits.

Figure 2:
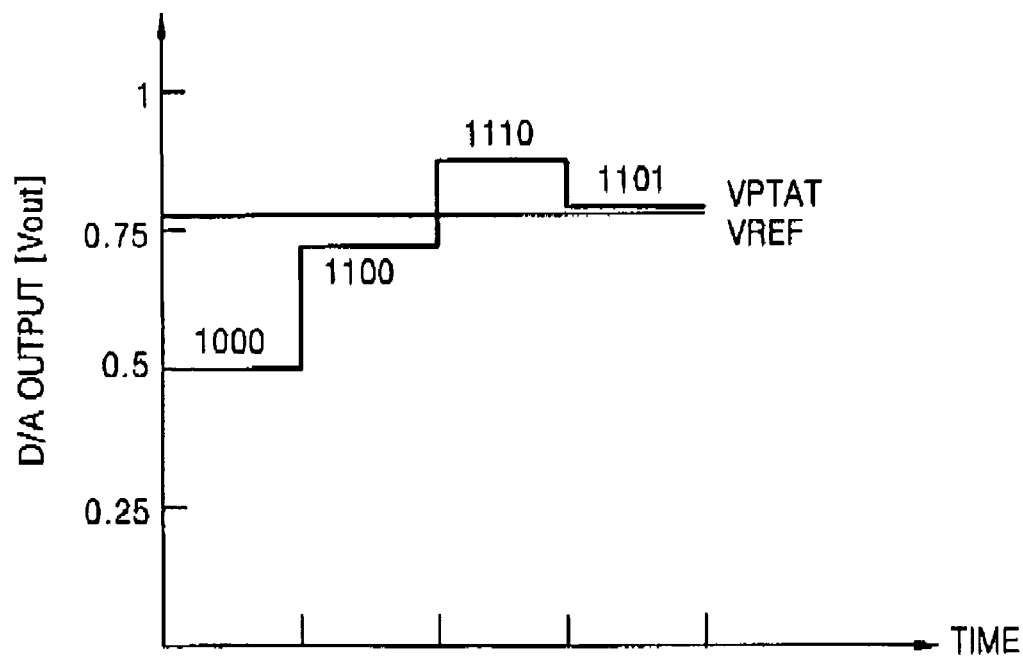
FIG. 2 is a graph illustrating a relationship among temperature sensing control data, a reference voltage, and a variable voltage of the temperature sensor of FIG. 1.

FIG. 2 is a graph illustrating a relationship among the temperature sensing control data SC[4:1], the reference voltage VREF, and the variable voltage VPTAT of the sensor circuit of FIG. 1. Referring to FIG. 2, when an initial value of the temperature sensing control data SC[4:1] is 1000, the D/A comparison circuit 11 operates to produce the variable voltage VPTAT at about 0.5 volts. When the reference voltage VREF is about 0.75 volts, it is not equivalent to the variable voltage VPTAT and, thus, the value of the temperature sensing control data SC[4:1] is changed to 1100 by the control circuit 15. The above process is repeated until the reference voltage VREF is substantially equal to the variable voltage VPTAT. A value 1101 of the temperature sensing control data SC[4:1] obtained when the reference voltage VREF is substantially equal to the variable voltage VPTAT is output as the value SCOUT corresponding to the current temperature.

Returning to FIG. 1, the D/A comparison circuit 11 includes the comparator 13, a voltage generator 111, a first direct current (DC) amplifier 112, an amplifier 113, a second DC amplifier 114, and a scaling circuit 115. The voltage generator 111 is controlled by adjusted control data AC[4:1], receives the current $I_p$ proportional to the temperature, and generates an internal reference voltage VREF1 that is held substantially constant regardless of temperature change and generates an internal variable voltage VPTAT1 that is proportional to temperature. The first DC amplifier 112 DC amplifies the internal variable voltage VREF1 and transmits an amplified voltage to the amplifier 113. The amplifier 113 amplifies the output of the first DC amplifier 112.

The second DC amplifier 114 DC amplifies the internal reference voltage VREF1 to produce a final reference voltage VREF to the comparator 13. The first and second DC amplifiers 112 and 114 are set to have substantially equal gains. The first and second DC amplifiers 112 and 114 may reduce the noise sensitivity of the internal variable voltage VPTAT1 and the internal reference voltage VREF1 when the resolution of the sensor circuit is high. In other words, use of the first and second DC amplifiers 112 and 114 is optional. The scaling circuit 115 is controlled by the temperature sensing control data SC[4:1] and generates the variable voltage VPTAT, which is proportional to the current temperature, from the amplified voltage produced by the amplifier 113.

The voltage generator 111 includes resistors Ra, Rb, Rc, R1, R4, R3, R4, and Rd, a bipolar transistor Q1, and switches S1, S2, S3, and S4. The resistor Ra is connected between a node at which the current $I_p$ is input and a node at which the internal variable voltage VPTAT1 is output. The resistor Rb is connected between the node at which the internal variable voltage VPTAT1 is output and a node at which the internal reference voltage VREF1 is output. A terminal of the resistor Rd is connected to an emitter of the bipolar transistor Q1. A base and collector of the bipolar transistor Q1 are connected to a ground voltage VSS.

The resistors R1, R2, R3 and R4 are connected in series between the node at which the internal reference voltage VREF1 is output and the other terminal of the resistor Rd. The switches S1, S2, S3, and S4 are connected in parallel with the respective resistors R1, R2, R3 and R4 and turn on or off according to respective bits of the adjusted control data AC[4:1]. A value of the resistor R1 is about 8 times greater than that of the resistor R4, a value of the resistor R2 is about 4 times greater than that of the resistor R4, and a value of the resistor R3 is about twice as great as the value of the resistor R4.

When, for example, all the switches S1, S2, S3, and S4 are turned off, the internal reference voltage VREF1 is maintained substantially constant over a range of temperatures due to a bandgap principle. The internal reference voltage VREF1 may be calculated by the following Equation (1):

$$VREF1 = Vbe + Ip \times (Rc + Rd + R1 + R2 + R3 + R4), \quad (1).$$

and the internal variable voltage VPTAT1, which is proportional to temperature, can be calculated by the following Equation (2):

$$VPTAT1 = Vbe + Ip \times (Rb + Rc + Rd + R1 + R2 + R3 + R4) \quad (2),$$

wherein Vbe denotes a voltage applied between the base and emitter of the bipolar transistor Q1. The resistors Rc and Rd are optional.

The scaling circuit 115 includes resistors Re, R5, R6, R7, R8, and Rf, and switches S5, S6, S7 and S8. The resistor Re is connected between an output node of the amplifier 113 and a node at which the variable voltage VPTAT is output. A terminal of the resistor Rf is connected to the ground voltage VSS. The resistors R5, R6, R7 and R8 are connected in series between the node at which the variable voltage VPTAT is output and the other terminal of the resistor Rf. The switches S5, S6, S7 and S8 are connected in parallel with respective ones of the resistors R5, R6, R7 and R8, and turn on or off responsive to respective bits of the temperature sensing control data SC[4:1]. The resistor Rf is optional.

Figure 3:
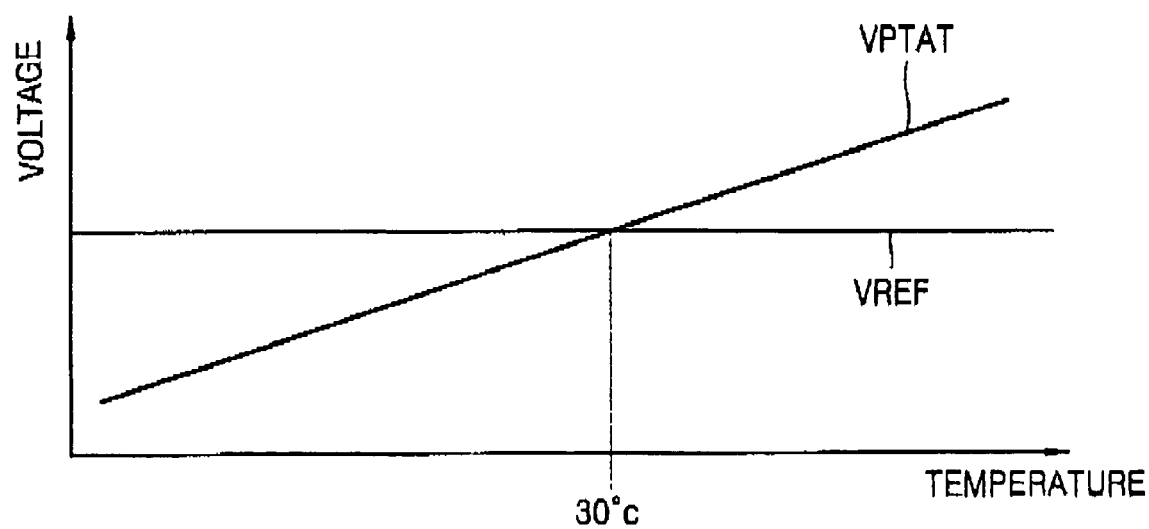
FIG. 3 is a graph illustrating a relationship among temperature, reference voltage, and variable voltage of the temperature sensor of FIG. 1.

FIG. 3 is a graph illustrating a relationship among the temperature, the reference voltage VREF, and the variable voltage VPTAT of the sensor circuit of FIG. 1. The adjusting and trimming circuit 17 is used to reduce a sensing error caused by external influences, such as variation in a manufacturing process. The adjusting and trimming circuit 17 provides the D/A comparison circuit 111 with adjusted control data AC[4:1] for reducing an error between the reference voltage VREF and the variable voltage VPTAT at a predetermined reference temperature, e.g., 30° C. The adjusted control data AC[4:1] corresponds to a value of data obtained when the reference voltage VREF is equivalent to the variable voltage VPTAT after transmission of the external data SCIN corresponding to the predetermined reference temperature to the D/A comparison circuit 11 via the control circuit 15 as the temperature sensing control data SC[4:1].

In other words, it may be difficult to precisely measure temperature when the reference voltage VREF is not equivalent to the variable voltage VPTAT at the predetermined reference temperature, e.g., 30° C., due to influences, such as a variation in the manufacturing process. To solve this problem, prior to driving the sensor circuit of FIG. 1, the external data SCIN corresponding to the predetermined reference temperature, e.g., 30° C., is transmitted to the D/A comparison circuit 11 via the control circuit 15 as the temperature sensing control data SC[4:1]. A value of data obtained when the sensor circuit is driven and the reference voltage VREF is equivalent to the variable voltage VPTAT, is stored as the adjusted control data AC[4:1] in the adjusting and trimming circuit 17. The adjusted control data AC[4:1] stored in the adjusting and trimming circuit 17 is sent to the D/A comparison circuit 11. The adjusting and trimming circuit 17 may include trimming elements, such as fuses.

Figure 4:
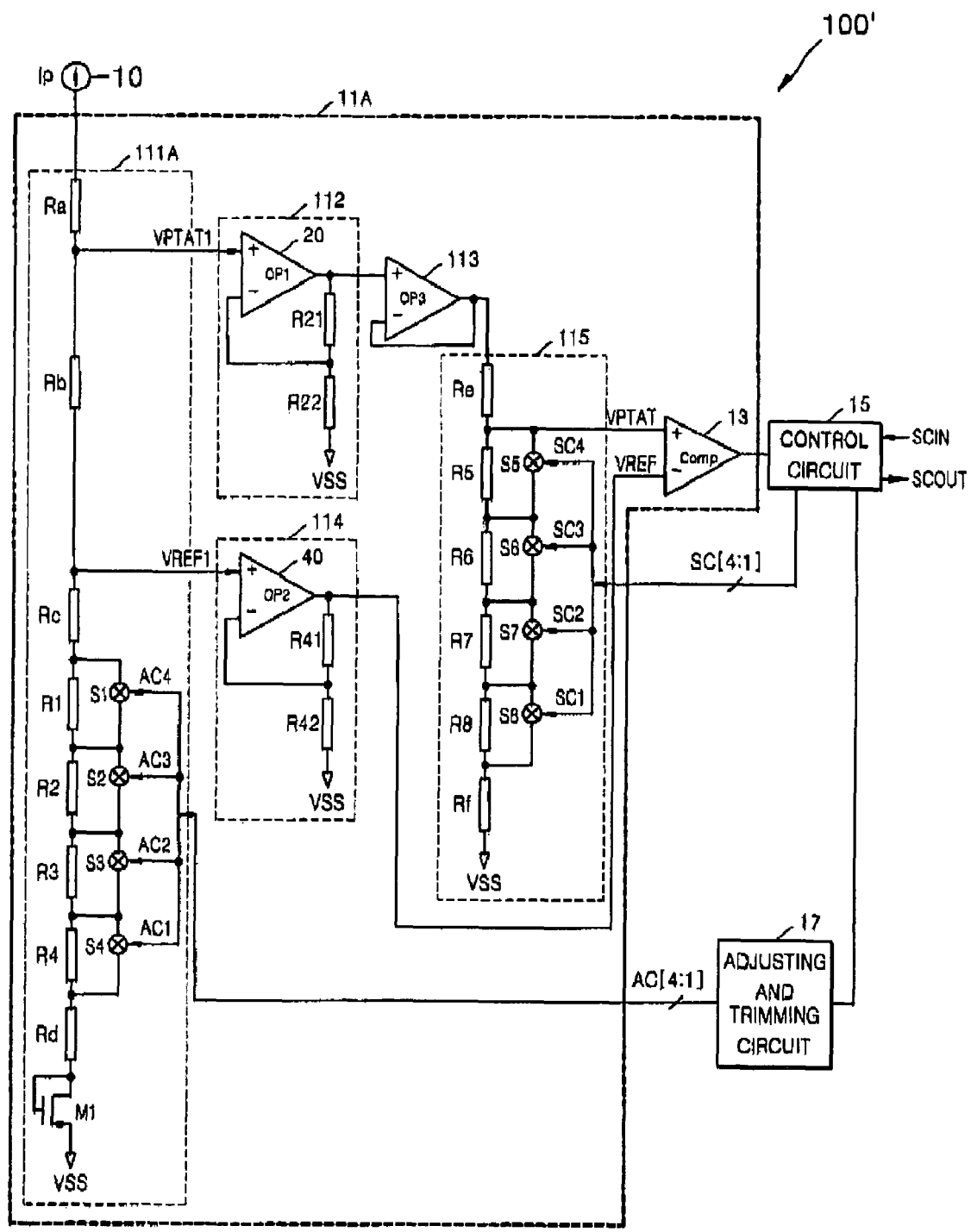
FIG. 4 is a schematic diagram of a temperature sensor according to further embodiments of the present invention.

FIG. 4 is a circuit diagram of a sensor circuit 100' according to further embodiments of the present invention. The sensor circuit 100' of FIG. 4 is similar to the sensor circuit 100 of FIG. 1, with like components indicated by like reference numerals, further description of which is omitted in light of the foregoing description of FIG. 1. The sensor circuit 100' includes a modified D/A comparison circuit 11' with a modified voltage generator 111A. As compared to the voltage generator 111 of FIG. 1, the voltage generator 111A includes a MOS transistor M1 rather than a bipolar transistor. The MOS transistor M1 has a gate and drain connected to each other, and operates in a weak inversion region. The operation of the sensor circuit 100' of FIG. 4 is substantially similar that of the sensor circuit 100 of FIG. 1, and further detailed description thereof will be omitted.

Figure 5:
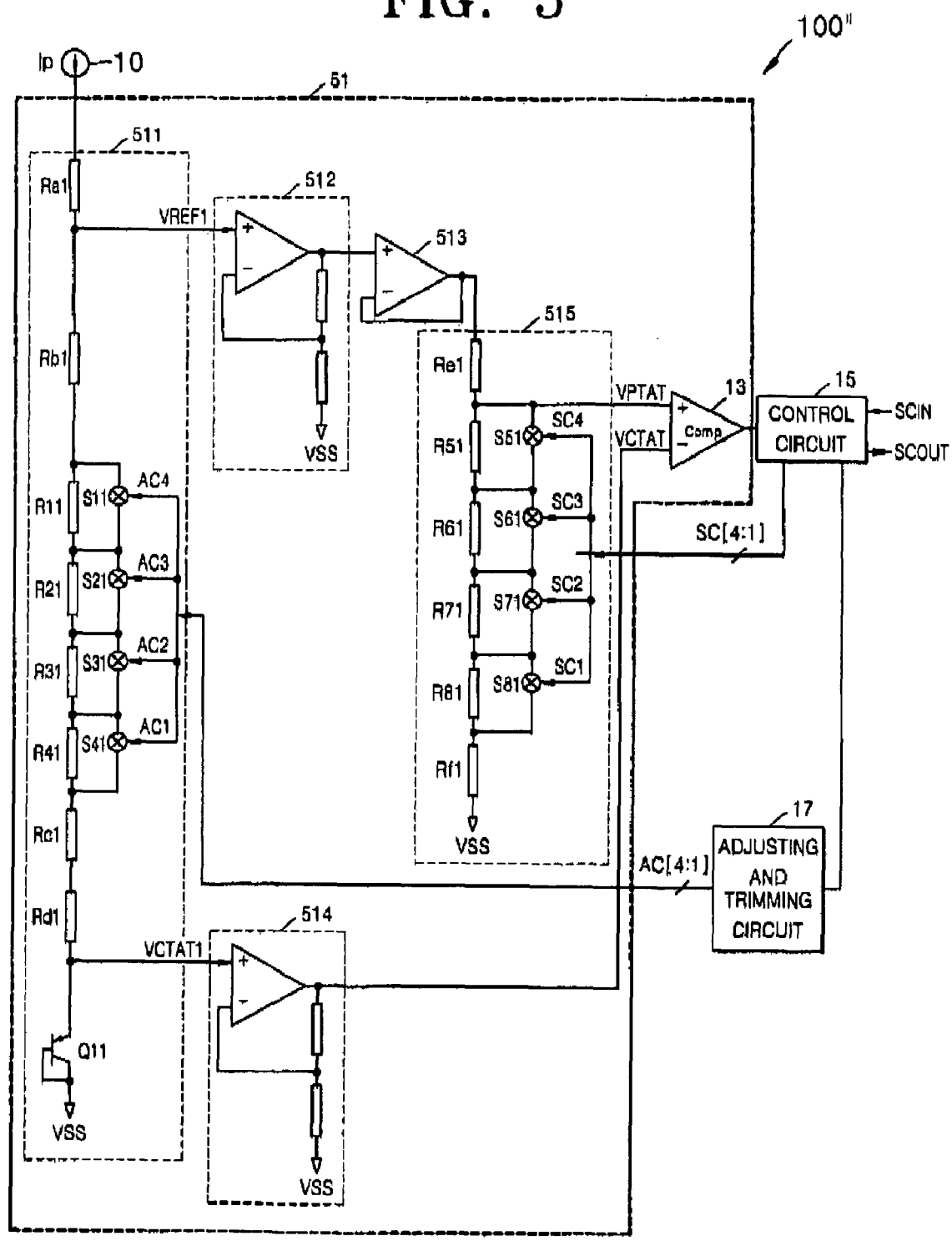
FIG. 5 is a schematic diagram of a temperature sensor according to yet further embodiments of the present invention.

FIG. 5 is a circuit diagram of a sensor circuit 100" according to yet other embodiments of the present invention.

The sensor circuit 100" of FIG. 5 is similar to the sensor circuit 100 of FIG. 1, with like components indicated by like reference numerals. The sensor circuit 100" differs from the sensor circuit 100 in that it has a D/A comparison circuit 51 with a different structure.

The D/A comparison circuit 51 receives a current $I_p$ proportional to temperature, and generates a reference voltage VREF that is maintained substantially constant over a range of temperatures and a variable voltage VCTAT that is inversely proportional to temperature, in response to temperature sensing control data SC[4:1]. The variable voltage VCTAT changes when the temperature sensing control data SC[4:1] changes. The current $I_p$ is generated by the transducer 10.

The D/A comparison circuit 51 includes a voltage generator 511, a first DC amplifier 512, an amplifier 513, a second DC amplifier 514, and a scaling circuit 515. The voltage generator 511 is controlled by adjusted control data AC[4:1], receives a current $I_p$ proportional to temperature and generates an internal reference voltage VREF1 that is maintained substantially constant over a range of temperatures and an internal variable voltage VCTAT1 that is inversely proportional to a current temperature. The DC amplifier 512 DC amplifies the internal reference voltage VREF1 and provides an amplified signal to the amplifier 513. The amplifier 513 amplifies the output of the first DC amplifier 512.

The second DC amplifier 514 DC amplifies the internal variable voltage VCTAT1, producing a variable voltage VCTAT that is provided to a comparator 13. The first and second DC amplifiers 512 and 514 may have the substantially equal gains. Use of the first and second DC amplifiers 512 and 514 can reduce noise sensitivity of the internal variable voltage VCTAT1 and the internal reference voltage VREF1 when the resolution of the sensor circuit is high. The scaling circuit 515 is controlled by the temperature sensing control data SC[4:1], receives the output of the amplifier 513 and generates a final reference voltage VREF.

The voltage generator 511 includes resistors Ra1, Rb1, Rc1, R11, R21, R31, R41, and Rd1, a bipolar transistor Q11, and switches S11, S21, S31 and S41. The resistor Ra1 is connected between a node at which the current $I_p$ is applied and a node at which the internal reference voltage VREF1 is output. A terminal of the resistor Rb1 is connected to the node at which the internal reference voltage VREF1 is output.

The resistors R11, R21, R31 and R41 are connected in series between the other terminal of the resistor Rb1 and a terminal of the resistor Rc1. The switches S11, S21, S31 and S41 are connected in parallel with respective ones of the resistors R11, R21, R31 and R41, and turn on or off responsive to respective bits of the adjusted control data AC[4:1]. A value of the resistor R11 is about eight times more than that of the resistor R41, a value of the resistor R21 is about four times more than that of the resistor R41, and a value of the resistor R31 is about twice as great as a value of the resistor R41. The other terminal of the resistor Rd1 is connected to an emitter of the bipolar transistor Q11. Both a base and collector of the bipolar transistor Q11 are connected to a ground voltage VSS.

Figure 6:
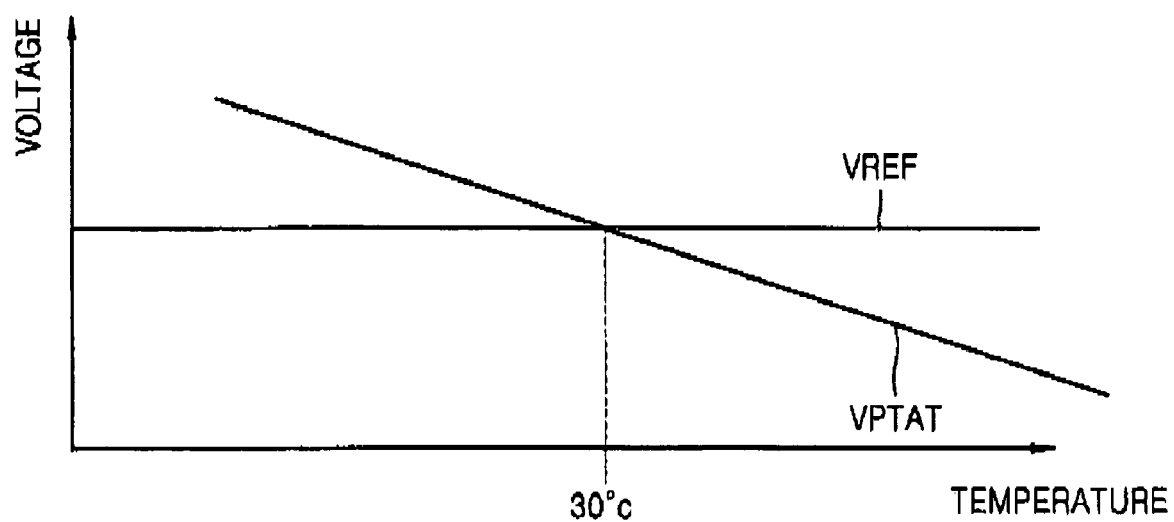
FIG. 6 is a graph illustrating a relationship among a temperature, a reference voltage, and a variable voltage of the temperature sensor of FIG. 5.

When all the switches S11, S21, S31 and S41 are turned off, the internal reference voltage VREF1 remains substantially constant over a range of temperatures and the internal variable voltage VCTAT1 becomes inversely proportional to temperature, according to the bandgap principle. Accordingly, as shown in FIG. 6, the final reference voltage VREF is maintained substantially constant over a range of temperatures and the final variable voltage VCTAT is inversely proportional to temperature. The resistors Rb1, Rc1, and Rd1 are optional.

The scaling circuit 515 includes resistors Re1, R51, R61, R71, R81, and Rf1 and switches S51, S61, S71 and S81. The resistor Re1 is connected between an output node of the amplifier 513 and a node at which the reference voltage VREF is output. A terminal of the resistor Rf1 is connected to the ground voltage VSS. The resistors R51, R61, R71 and R81 are connected in series between the node at which the reference voltage VREF is output and the other terminal of the resistor Rf1. The switches S51, S61, S71 and S81 are connected in parallel with respective ones of the resistors R51, R61, R71 and R81, and turn on or off responsive to respective bits of the temperature sensing control data SC[4:1]. The resistor Rf1 is optional.

Figure 7:
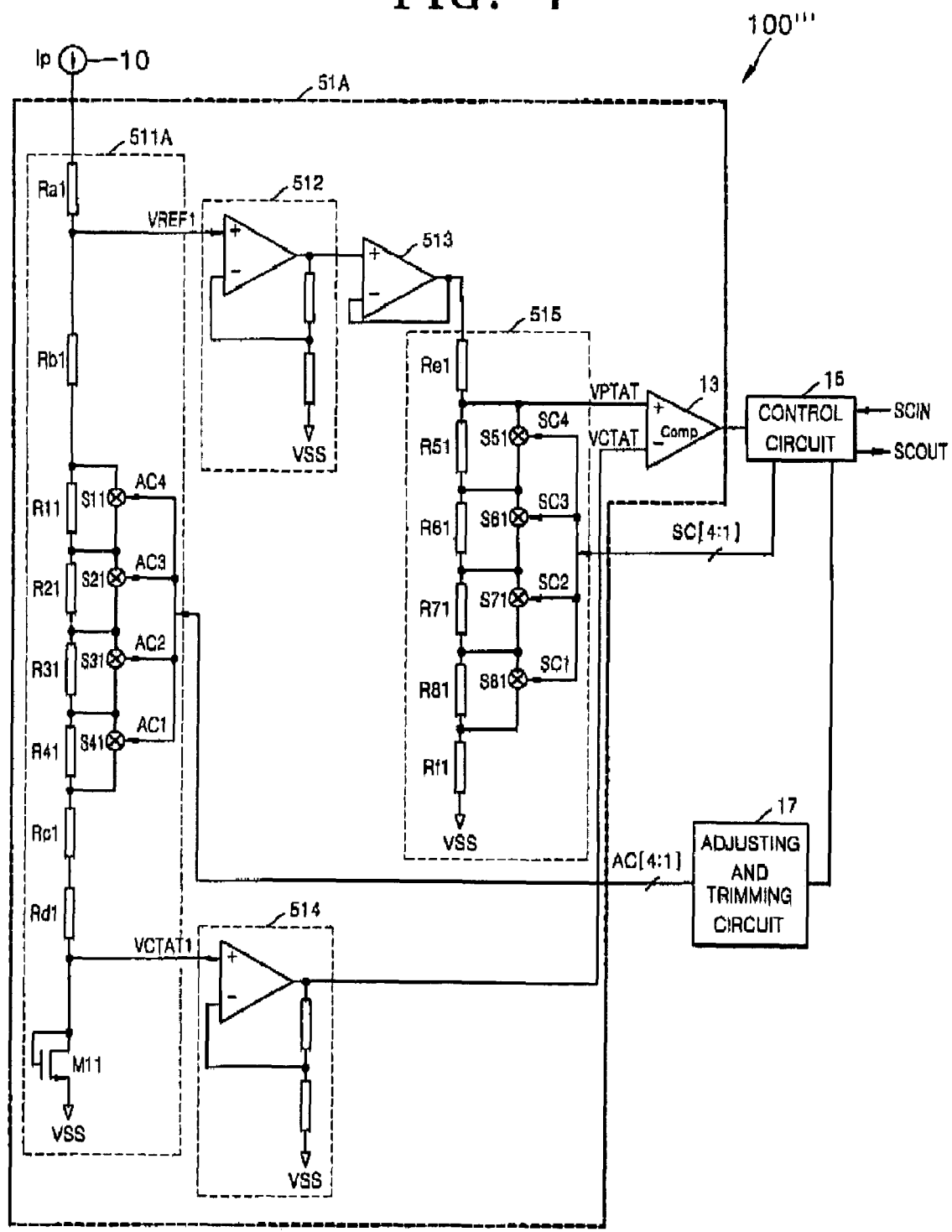
FIG. 7 is a schematic diagram of a temperature sensor according to additional embodiments of the present invention.

FIG. 7 is a circuit diagram of a sensor circuit 100'" according to still further embodiments of the present invention. The sensor circuit 100'" of FIG. 7 is similar to the sensor circuit 100" of FIG. 5, with like components indicated by like reference numerals. The sensor circuit 100'" has a different voltage generator 511A included in a D/A comparison circuit 51A. The voltage generator 511A includes a MOS transistor M11 rather than a bipolar transistor. The MOS transistor M11 has a gate and drain connected to one another and operates in a weak inversion region. The operation of the sensor circuit of FIG. 7 is almost the same as the sensor circuit of FIG. 5 and a detailed description thereof will be omitted.

Figure 8:
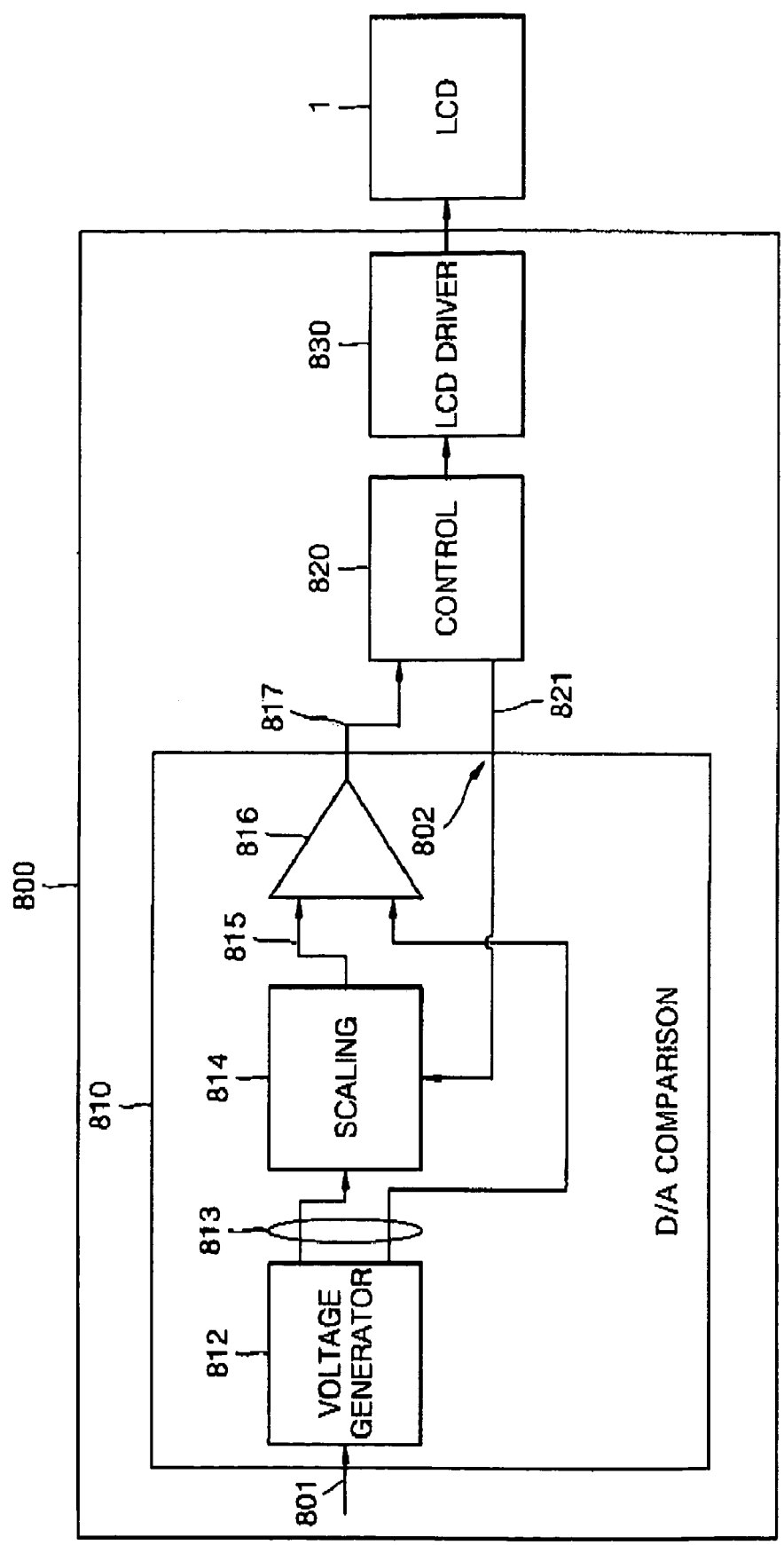
FIG. 8 is a schematic diagram illustrating an LCD driving IC according to some embodiments of the present invention.

FIG. 8 is a schematic diagram of an LCD driving IC 800 according to further embodiments of the present invention. The IC 800 includes a D/A comparison circuit 810 having an analog sense current input 801 and a digital input 802. The D/A comparison circuit 810 is operative to compare a digital value at the digital input 802 to a sense current at the sense current input 801 and to responsively generate a comparison signal 817. The IC 800 also includes a control circuit 820 configured to provide a digital signal 821 to the digital input 802 of the D/A comparison circuit 810 responsive to the comparison signal 817 and to generate a digital output 823 corresponding to the sense current. The IC 800 further includes an LCD driving circuit 830 operative to drive an LCD 1 responsive to the generated digital output 823.

As shown, the D/A comparison circuit 810 comprises a voltage generator circuit 812 that generates reference and variable voltages 813 responsive to the sense current and a scaling circuit 814 that scales a first one of the reference and variable voltages 813 responsive to the digital signal 821. The D/A comparison circuit 810 further includes a voltage comparator 816 that generates the comparison signal 817 responsive to a comparison of the scaled first one of the reference and variable voltages 813 and a second one of the reference and variable voltages 813. The D/A comparison circuit 810 and the control circuit 820 may have any of a variety of configurations and operations, such as those described above with reference to FIGS. 1-7.

As described above, sensor circuits and methods of operation thereof according to various embodiments of the present invention can precisely sense a current temperature and generate a digital value corresponding to the sensed temperature, and can be integrated into in an integrated circuit (IC), such as an LCD driving IC. Thus, installation of the sensor circuit into an LCD driving IC allows LCD driving voltages of temperature sections that are generated by the LCD driving IC to be automatically changed responsive to temperature variations. As a result, contrast of an LCD may be maintained over a range of temperatures.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A sensor circuit comprising:
   a digital to analog (D/A) comparison circuit comprising an analog sense current input, a digital input and a plurality of series-coupled resistors throuah which an analog sense current at the analog sense current input passes, the D/A comparison circuit configured to generate first and second voltages responsive to respective nodes of the plurality of series-coupled resistors, to scale the second voltage responsive to a digital value at the digital input and to compare the scaled second voltage to the first voltage to generate a comparison signal; and
   a control circuit configured to provide digital values to the digital input of the D/A comparison circuit responsive to the comparison signal and to generate a digital output corresponding to the sense current.

2. A circuit according to claim 1, wherein the D/A comparison circuit comprises:
   a voltage generator circuit that generates a reference voltage and a variable voltage responsive to the sense current;
   a scaling circuit that scales the variable voltage responsive to the digital value; and
   a voltage comparator that generates the comparison signal responsive to a comparison of the scaled variable voltage and the reference voltage.

3. A circuit according to claim 2, wherein the scaling circuit comprises:
   a plurality of resistors coupled in series between a node that develops the variable voltage and a signal ground node; and
   a plurality of switches, respective ones of which are configured to bypass respective ones of the plurality of resistors responsive to respective bits of the digital value at the digital input.

4. A circuit according to claim 2, wherein the voltage generator circuit comprises a bandgap reference circuit.

5. A circuit according to claim 2, wherein the D/A comparison circuit has a reference adjustment input, and wherein the voltage generator circuit is operative to adjust the reference voltage responsive to a digital value at the reference adjustment input.

6. A circuit according to claim 5, wherein the voltage generator circuit comprises:
   a plurality of resistors coupled in series between a node that develops the reference voltage and a signal ground node; and
   a plurality of switches, respective ones of which are configured to bypass respective ones of the plurality of resistors responsive to respective bits of the digital value at the reference adjustment input.

7. A circuit according to claim 2, wherein the voltage generator circuit comprises:
   a first resistor connected between the sense current input and a node at which the variable voltage is developed;
   a second resistor connected between the node at which the variable voltage is developed and a node at which the reference voltage is developed;
   a bipolar transistor having its base terminal coupled to its collector terminal and a signal ground node; and
   a third resistor connected between an emitter terminal of the bipolar transistor and the node at which the reference voltage is developed.

8. A circuit according to claim 7, wherein the third resistor comprises a plurality of resistors connected in series between the emitter terminal of the bipolar transistor and the node at which the variable voltage is developed, and wherein the voltage generator circuit further comprises a plurality of switches, respective ones of which are coupled in parallel with respective ones of the plurality of resistors.

9. A circuit according to claim 2, wherein the voltage generator circuit comprises:
   a first resistor connected between the sense current input and a node at which the variable voltage is developed;
   a second resistor connected between the node at which the variable voltage is developed and a node at which the reference voltage is developed;
   a field effect transistor having its gate terminal coupled to its drain terminal and a signal ground node; and
   a third resistor connected between a source terminal of the field effect transistor and the node at which the reference voltage is developed.

10. A circuit according to claim 9, wherein the third resistor comprises a plurality of resistors connected in series between the source terminal of the field effect transistor and the node at which the variable voltage is developed, and wherein the voltage generator circuit further comprises a plurality of switches, respective ones of which are coupled in parallel with respective ones of the plurality of resistors.

11. A circuit according to claim 1, wherein the D/A comparison circuit comprises:
    a voltage generator circuit that generates a reference voltage and a variable voltage responsive to the sense current;
    a scaling circuit that scales the reference voltage responsive to the digital value; and
    a voltage comparator that generates the comparison signal responsive to a comparison of the variable voltage and the scaled reference voltage.

12. A circuit according to claim 11, wherein the scaling circuit comprises:
    a plurality of resistors coupled in series between a node that develops the reference voltage and a signal ground node; and
    a plurality of switches, respective ones of which are configured to bypass respective ones of the plurality of resistors responsive to respective bits of the digital value at the digital input.

13. A circuit according to claim 11, wherein the voltage generator circuit comprises a bandgap reference circuit.

14. A circuit according to claim 11, wherein the D/A comparison circuit has a reference adjustment input, and wherein the voltage generator circuit is operative to adjust the reference voltage responsive to a digital value at the reference adjustment input.

15. A circuit according to claim 14, wherein the voltage generator circuit comprises:
    a plurality of resistors coupled in series between a node that develops the reference voltage and a signal ground node; and
    a plurality of switches, respective ones of which are configured to bypass respective ones of the plurality of resistors responsive to respective bits of the digital value at the reference adjustment input.

16. A circuit according to claim 11, wherein the voltage generator circuit comprises:

a first resistor connected between the sense current input and a node at which the reference voltage is developed;
a second resistor connected between the node at which the reference voltage is developed and a node at which the variable voltage is developed; and
a bipolar transistor having its base terminal coupled to its collector terminal and a signal ground node and its emitter terminal coupled to the node at which the variable voltage is developed.

17. A circuit according to claim 16, wherein the second resistor comprises a plurality of resistors connected in series between the emitter terminal of the bipolar transistor and the node at which the reference voltage is developed, and wherein the voltage generator circuit further comprises a plurality of switches, respective ones of which are coupled in parallel with respective ones of the plurality of resistors.

18. A circuit according to claim 11, wherein the voltage generator circuit comprises:
a first resistor connected between the sense current input and a node at which the reference voltage is developed;
a second resistor connected between the node at which the reference voltage is developed and a node at which the variable voltage is developed; and
a field effect transistor having its gate terminal coupled to its drain terminal and a signal ground node and its source terminal coupled to the node at which the variable voltage is developed.

19. A circuit according to claim 18, wherein the second resistor comprises a plurality of resistors connected in series between the source terminal of the field effect transistor and the node at which the reference voltage is developed, and wherein the voltage generator circuit further comprises a plurality of switches, respective ones of which are coupled in parallel with respective ones of the plurality of resistor.

20. A circuit according to claim 1, further comprising an adjustment circuit operative to control the first voltage and/or the second voltage.

21. A temperature sensor comprising:
a digital to analog (D/A) comparison circuit comprising an analog sense current input, a digital input and a plurality of series-coupled resistors through which an analog sense current at the analog sense current input passes, the D/A comparison circuit configured to generate first and second voltages responsive to respective nodes of the plurality of series-coupled resistors, to scale the second voltage responsive to a digital value at the digital input and to compare the scaled second voltage to the first voltage to generate a comparison signal;
a control circuit configured to provide digital values to the digital input of the D/A comparison circuit responsive to the comparison signal and to generate a digital output corresponding to the sense current; and
a temperature transducer operative to generate a current at the analog current sense input responsive to temperature.

22. A sensor according to claim 21, wherein the D/A comparison circuit comprises:
a voltage generator circuit that generates a reference voltage and a variable voltage responsive to the sense current;
a scaling circuit that scales a first one of the variable voltage and the reference voltage responsive to the digital value; and
a voltage comparator that generates the comparison signal responsive to a comparison of the scaled first one of the variable voltage and the reference voltage to a second one of the variable voltage and the reference voltage.

23. A sensor according to claim 22, further comprising an adjustment circuit operative to adjust the reference voltage.

24. A sensor according to claim 21, wherein the D/A comparison circuit and the control circuit are included in an integrated circuit.

25. A liquid crystal display (LCD) driving integrated circuit (IC) comprising:
a digital to analog (D/A) comparison circuit comprising an analog sense current input, a digital input and a plurality of series-coupled resistors through which an analog sense current at the analog sense current input passes, the D/A comparison circuit configured to generate first and second voltages responsive to respective nodes of the plurality of series-coupled resistors, to scale the second voltage responsive to a digital value at the digital input and to compare the scaled second voltage to the first voltage to generate a comparison signal;
a control circuit configured to provide digital values to the digital input of the D/A comparison circuit responsive to the comparison signal and to generate a digital output corresponding to the sense current; and
an LCD driving circuit operative to drive an LCD responsive to the generated digital output.

26. An LCD driving IC according to claim 25, wherein the D/A comparison circuit comprises:
a voltage generator circuit that generates a reference voltage and a variable voltage responsive to the sense current;
a scaling circuit that scales a first one of the variable voltage and the reference voltage responsive to the digital value; and
a voltage comparator that generates the comparison signal responsive to a comparison of the scaled first one of the variable voltage and the reference voltage to a second one of the variable voltage and the reference voltage.

27. An LCD driving IC according to claim 25, further comprising an adjustment circuit operative to adjust the first voltage and/or the second voltage.

28. An LCD driving IC according to claim 25, wherein the sense current represents temperature.

* * * * *